US011262660B2

(12) United States Patent
Horn et al.

(10) Patent No.: US 11,262,660 B2
(45) Date of Patent: Mar. 1, 2022

(54) IMAGE SENSOR, POSITION SENSOR DEVICE, LITHOGRAPHY SYSTEM, AND METHOD FOR OPERATING AN IMAGE SENSOR

(71) Applicant: Carl Zeiss SMT GmbH, Oberkochen (DE)

(72) Inventors: Jan Horn, Munich (DE); Ulrich Bihr, Kirchheim/Dirgenheim (DE); Andy Zott, Gerstetten (DE); Markus Deguenther, Florstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/987,504

(22) Filed: Aug. 7, 2020

(65) Prior Publication Data

US 2020/0363731 A1 Nov. 19, 2020

Related U.S. Application Data

(63) Continuation of application No. PCT/EP2019/053298, filed on Feb. 11, 2019.

(30) Foreign Application Priority Data

Feb. 12, 2018 (DE) .......................... 102018202096.5

(51) Int. Cl.
 *G03F 7/20* (2006.01)
(52) U.S. Cl.
 CPC ........ *G03F 7/70258* (2013.01); *G03F 7/7015* (2013.01); *G03F 7/70316* (2013.01)
(58) Field of Classification Search
 CPC ............... G03F 7/70258; G03F 7/7015; G03F 7/70316; G03F 7/70775; G03F 7/70841; G03F 7/7085; G01B 11/002; G01B 9/02091; G02B 6/12007; G02B 6/12014; G02B 6/124; G02B 6/4215; G02B 6/12011; G02B 6/34; G01N 21/45; G01N 21/41;

(Continued)

(56) References Cited

U.S. PATENT DOCUMENTS

| 4,601,537 A | 7/1986 | Saccocio et al. |
| 2004/0227915 A1* | 11/2004 | Ohtsuka .............. G03F 7/70258 355/52 |

(Continued)

FOREIGN PATENT DOCUMENTS

| DE | 10 2015 209 077 A1 | 11/2016 |
| DE | 10 2015 209 259 A1 | 11/2016 |

(Continued)

OTHER PUBLICATIONS

International Search Report issued in corresponding International Application No. PCT/EP2019/053298 dated Jun. 25, 2019, totaling 14 pages.

(Continued)

*Primary Examiner* — Mesfin T Asfaw
(74) *Attorney, Agent, or Firm* — Fish & Richardson P.C.

(57) ABSTRACT

An image sensor for a position sensor apparatus for ascertaining a position of at least one mirror of a lithography apparatus includes: a plurality of integrated optical waveguides; a plurality of incoupling areas; a multiplexer apparatus; and an image reconstruction apparatus.

20 Claims, 8 Drawing Sheets

(58) Field of Classification Search
CPC ........... G01N 21/7743; G01N 21/6454; G01N 21/648; C12Q 1/6874; G01D 5/35383; A61B 5/0084
See application file for complete search history.

(56) References Cited

U.S. PATENT DOCUMENTS

2013/0050674 A1   2/2013  Prosyentsov et al.
2018/0067400 A1   3/2018  Hom et al.

FOREIGN PATENT DOCUMENTS

EP          0 070 017 A1    2/2013
WO     WO 2017/186458 A1   11/2017

OTHER PUBLICATIONS

European Office Action, with translation thereof, for corresponding EP Appl No. 19 711 500.9, dated Apr. 16, 2021.

* cited by examiner

IMAGE SENSOR, POSITION SENSOR DEVICE, LITHOGRAPHY SYSTEM, AND METHOD FOR OPERATING AN IMAGE SENSOR

CROSS-REFERENCE TO RELATED APPLICATIONS

The present application is a continuation of, and claims benefit under 35 U.S.C. § 120 to, international application PCT/EP2019/053298, filed Feb. 11, 2019, which claims benefit under 35 USC 119 of German Application No. 10 2018 202 096.5, filed Feb. 12, 2018. The entire disclosure of each of these applications is incorporated by reference herein.

FIELD

The present disclosure relates to an image sensor for a position sensor apparatus, a position sensor apparatus including such an image sensor, a lithography apparatus including such a position sensor apparatus, and a method for operating such an image sensor, such a position sensor apparatus, and/or such a lithography apparatus.

BACKGROUND

By way of example, lithography apparatuses are used in the production of integrated circuits or ICs for imaging a mask pattern in a mask onto a substrate such as e.g. a silicon wafer. In so doing, a light beam generated by an optical system is directed through the mask onto the substrate.

In this case, the representable structure dimension can depend greatly on the light wavelength used. In order to attain particularly small structures, it is often desirable to use radiation of particularly short wavelength. EUV lithography apparatuses use light having a wavelength in the range of 5 nm to 30 nm, in particular 13.5 nm. "EUV" denotes "extreme ultraviolet". In the case of such lithography apparatuses, owing to the high absorption of light of this wavelength by most materials, reflective optical units, that is to say mirrors, are usually used instead of refractive optical units, that is to say lens elements. Moreover, in general, the housing in which the imaging optical unit is situated is evacuated because even the presence of a gas can result in great absorption of the radiation.

The mirrors may be secured to a force frame, for example, and may be configured to be at least partially manipulable or tiltable in order to allow a movement of a respective mirror in up to six degrees of freedom, and consequently a highly accurate positioning of the mirrors in relation to one another, in particular in the pm range. This can allow changes in the optical properties that occur for instance during the operation of the lithography apparatus, for example as a result of thermal influences, to be corrected.

For the purposes of aligning the mirrors, such as in the six degrees of freedom, actuators which are driven by way of a control loop can be assigned to the mirrors. An apparatus for monitoring the tilt angle of a respective mirror, for example, can be provided as part of the control loop.

Document DE 10 2015 209 259 A1 describes a position sensor apparatus, in which an image sensor captures a pattern coupled to a mirror. There is a known relationship between the image of the pattern on the image sensor and a deflection of the mirror from a rest position. Consequently, the position of the mirror relative to the rest position can be deduced from the image recorded by the image sensor.

SUMMARY

Cooling the system can present a technical problem, particularly in the case of evacuated exposure systems, because there may be no heat transfer medium in the space between the individual components. Therefore, designing used components in such a way that these generate as little heat as possible during operation can be desirable.

The present disclosure seeks to provide an improved image sensor.

According to a first aspect, an image sensor for a position sensor apparatus for ascertaining a position of at least one mirror of a lithography apparatus is proposed. The image sensor includes a plurality $N1$ of integrated optical waveguides and a plurality $N2$ of incoupling areas, with $N2 \geq N1$, each of the $N2$ incoupling areas being assigned to one of the $N1$ integrated optical waveguides and configured to couple incident light into the assigned integrated optical waveguide in such a way that a light signal is generated in the assigned integrated optical waveguide. Furthermore, the image sensor includes a multiplexer apparatus, coupled to the $N1$ integrated optical waveguides, for multiplexing the light signals generated in the $N1$ integrated optical waveguides to a number $N3$ of secondary optical waveguides, with $N1 \geq N3$, and an image reconstruction apparatus, coupled to the $N3$ secondary optical waveguides, for reconstructing an image on the basis of the light signals of the $N3$ secondary optical waveguides.

The image sensor can be considered as divided into three modules: An internal group, also referred to as a sensor front end, a signal connection, and an external group. The internal group is arranged at the location where an image should be captured, for example in an evacuated housing of a projection optical unit of an EUV lithography apparatus. The external group can be flexibly arranged at another location, for example outside of the housing of the projection optical unit. The signal connection transfers signals, for example optical and/or electrical signals, between the internal group and the external group.

In some embodiments, the image sensor can provide the advantage of being able to use a reduced number of electronic components for the purposes of capturing an image at the location of a sensor surface of the image sensor. For example, the image reconstruction apparatus can be arranged at a location distant from the sensor front end, for example outside of an evacuated projection optical unit of a lithography apparatus. Consequently, the light signals are not already converted into an electronically processable signal, in particular as a digital image, on or directly at the sensor surface, as would be the case for CCD or CMOS sensors, for example, but only in the image reconstruction apparatus arranged elsewhere. As a result, less thermal energy may arise in the sensor front end in comparison with purely electronic image sensors.

The sensor front end can include a substrate. For example, the latter can be embodied as an integrated optical image sensor and having at least the $N1$ integrated optical waveguides and the $N2$ incoupling areas. It can also be referred to as a chip or microchip. The integrated optical image sensor can also be referred to as a photonic image sensor. For example, the image sensor for capturing the image includes a chip manufactured in integrated fashion, the chip having, e.g., a layer structure in which the plurality $N1$ of integrated optical waveguides and the plurality $N2$ of incoupling areas are integrated. Considered substrate materials for the chip include, in particular, silicon, silicon oxide, silicon carbide, group III-V semiconductor materials, such as, e.g., indium phosphide, and different glasses such as fused quartz. To produce the integrated optical structures, for example the optical waveguides, use can be made of methods known from microchip manufacturing, in particular various coating and/or patterning methods. By way of example, an integrated optical chip thus manufactured has a structure dimension of less than 10 µm and is configured, for example, to transmit input coupled light substantially without losses.

To couple light into the N1 integrated optical waveguides, provision can be made of N2 incoupling areas. An incoupling area can be assigned to a respective integrated optical waveguide. Here, a plurality of incoupling areas could be assigned to the same integrated optical waveguide. For example, the incoupling area is arranged at the start of the integrated optical waveguide to which it is assigned. The start is understood to mean, in particular, an end of the integrated optical waveguide arranged at the surface of the integrated optical image sensor. By way of example, the incoupling area can be considered to be the start of the integrated optical waveguide. For example, the incoupling area can have coatings, such as color filters, Bragg filters, antireflection coatings, etc., and/or be patterned. By way of example, each incoupling area is an area at least partly transparent from an optical point of view. The side of the incoupling area facing the integrated optical waveguide is referred to, for example, as input coupling side or else back side. The side facing the space in front of the integrated optical image sensor is referred to, for example, as surface of the incoupling area.

If a light beam is radiated or incident on the surface of the incoupling area, at least part of the light beam can be coupled into the integrated optical waveguide and hence a light signal is generated in the integrated optical waveguide. For example, the generated light signal may be understood to mean the input coupled part of the incident light beam rather than a light signal newly generated by a light source. In particular, the generated light signal can depend on properties of the light beam and on properties of the incoupling area. In particular, information transported by the incident light beam can also be transferred into the light signal. Further, a color-filtered light signal and/or polarized light signal can be generated by an appropriate embodiment of the incoupling area, for example, in particular without the information transported originally by the light beam being lost.

A multiplexer apparatus can be coupled to the other end of the N1 integrated optical waveguides. In particular, the multiplexer apparatus can be embodied as an active integrated optical component. The multiplexer apparatus can be integrated on the same chip as the N2 incoupling areas and the N1 integrated optical waveguides. Alternatively, the multiplexer apparatus can be integrated on one or more further chips. The multiplexer apparatus can be configured to multiplex the light signals, supplied by the N1 integrated optical waveguides, to a number N3 of secondary optical waveguides. To this end, the multiplexer apparatus can include, for example, a number of switchable integrated optical structures. The switchable integrated optical structures can be embodied, for example, as acousto-optic and/or electro-optic components. Here, the switchable integrated optical structures can be drivable and/or switchable via an integrated electronic circuit, in particular. Depending on a switching position of a respective switchable integrated optical structure, the light signal can be switched or multiplexed from one of the N1 integrated optical waveguides to one of the N3 secondary optical waveguides. In the process, the light signal can be coupled into the respective secondary optical waveguide, as a result of which a corresponding light signal is generated in the latter.

For example, the N3 secondary optical waveguides may not integrated optical waveguides but are embodied, for example, as optical fibers. Therefore, the N3 secondary optical waveguides may be configured to transfer the light signals along almost any path. In particular, damping of the input coupled light signals in the N3 secondary optical waveguides can be low, and so the N3 secondary optical waveguides can have a length in the range of several meters, for example up to 10 m or else up to 50 m, but the light signals may still able to be captured.

The N3 secondary optical waveguides can be configured to guide the input coupled light signals to the image reconstruction apparatus. The image reconstruction apparatus can be configured, for example, to capture the light signals from the N3 secondary optical waveguides and reconstruct an image on the basis of the captured light signals. In particular, the image reconstruction apparatus can include a number of electronic components, such as one or more photodiodes for capturing and converting the light signals into electronic signals, an analog-to-digital converter (A/D converter), and/or an image processor. To capture the light signals, the ends of the N3 secondary optical waveguides facing the image reconstruction apparatus can be arranged so that the light signals are able to emerge from the N3 secondary optical waveguides and be incident on the photodiode. In addition or as an alternative to the photodiode, provision can also be made of a CCD sensor, a CMOS sensor, and/or a photomultiplier. By way of example, the electrical signal generated by the photodiode on the basis of the light signals can be converted into a digital signal by an A/D converter, the digital signal being processable by a digital electronic circuit such as the image processor or a CPU. The image processor can be implemented in terms of hardware and/or else in terms of software. In the case of an implementation in terms of hardware, the image processor can be embodied as a computer or as a microprocessor, for example. In the case of an implementation in terms of software, the image processor can be embodied as a computer program product, as a function, as a routine, as part of a program code or as an executable object.

The image reconstructed in this way by the image reconstruction apparatus can have N2 pixels, for example, each pixel of the reconstructed image having an information item correlated with the light incident on the respective one of the N2 incoupling areas.

In particular, the light signals can be captured in such a way that a unique assignment of a respective captured light signal to one of the N2 incoupling areas is ensured. To this end, a synchronization device, for example, which can for example be part of the image processor, can provide a synchronization signal or else a trigger signal. By way of example, this synchronization signal can be used to drive the multiplexer apparatus and the A/D converter. To which of the N1 integrated optical waveguides a light signal captured and digitized at a certain time may be assigned can therefore be ascertained taking account of a signal propagation time, for example. Should light signals of different incoupling areas be frequency encoded, for example, this can be taken into account accordingly when capturing the light signals, for example by a color filter wheel.

Below, an example describes the operating principle of the image sensor. By way of example, the integrated optical image sensor has a plurality N2=16 incoupling areas, which are arranged in a matrix of four columns and four rows. This could also be referred to as a 4×4 array. By way of example, the integrated optical image sensor has a plurality N1=16 integrated optical waveguides. Exactly one of the 16 incoupling areas is assigned to each of the 16 integrated optical waveguides. By way of example, the multiplexer apparatus has four switchable integrated optical structures, which each multiplex four inputs to one output, one of the integrated optical structures respectively being assigned to a row of the integrated optical image sensor. This could also be referred to as a 16×4 multiplexer. The four integrated optical waveguides of one row are fed to the four inputs of the switchable integrated optical structure assigned to this row, the switchable integrated optical structure having a secondary optical waveguide coupled to the output thereof. Thus, a total of four secondary optical waveguides are provided in this example, each coupling to one of the switchable integrated optical structures of the multiplexer apparatus. The four secondary optical waveguides guide light signals coupled therein to a respective photodiode of the image reconstruction apparatus, the latter therefore having four individual photodiodes. The synchronization device clocks, for example, the four switchable integrated optical structures of the multiplexer apparatus in such a way that, over a certain time interval, for example the light signals of the incoupling areas forming the first column are coupled into the secondary optical waveguides and captured by the respective photodiode. In a next time interval, there is, for example, a switch such that then the light signals of the second column are captured, etc. Overall, this allows an image information item, for example a pattern present on the sensor surface of the integrated optical image sensor with the N2 incoupling areas, to be captured. Without loss of generality, N1=16, N2=16, N3=4, and four photodiodes were chosen in the preceding example.

According to some embodiments of the image sensor, the plurality N2 of incoupling areas, the plurality N1 of integrated optical waveguides and the multiplexer apparatus are integrated on a substrate, in particular on an integral substrate.

Consequently, the integrated optical image sensor can be formed on a single microchip using known manufacturing methods. In particular, the microchip can have both integrated optical structures and integrated electronic structures. By way of example, the integrated optical image sensor can have contact points for driving the multiplexer apparatus, which contact points can be attached to the front side of the microchip and/or to the back side of the microchip. In particular, the synchronization signal and/or further control signals for the multiplexer apparatus can be transferred to the microchip via these contact points.

An integral substrate is understood to mean, in particular, that the substrate for the entire integrated optical image sensor has been produced from the same original wafer and has not been joined together. This could also be referred to as a monolithically integrated circuit.

According to some embodiments of the image sensor, the multiplexer apparatus is configured to multiplex the light signals via a time-division multiplexing method, a frequency-division multiplexing method, and/or a code-division multiplexing method.

In a time-division multiplexing method, different signals are separated from one another in time. In a frequency-division multiplexing method, different signals are transferred simultaneously at different frequencies. By way of example, such signals can be generated using color filters and can also be separated by color filters again. In a code-division multiplexing method, a plurality of different signals are transferred simultaneously in encoded fashion and with different code sequences, for example spreading code sequences. In particular, the different signals can correspond to different light signals, generated by the N2 incoupling areas, in the N1 integrated optical waveguides.

By way of example, the time-division multiplexing method can be used if N1=N2. Should N1<N2, a frequency-division multiplexing method, for example, is suitable for discriminating the light signals generated in a respective integrated optical waveguide by different incoupling areas. By way of example, the surfaces of the N2 incoupling areas have different color filters to this end.

According to some embodiments of the image sensor, the image reconstruction apparatus includes a capturing device for capturing the light signals of the N3 secondary optical waveguides and a synchronization device. The synchronization device can be configured to drive the multiplexer apparatus via a synchronization signal in such a way that a respective light signal captured by the capturing device is uniquely assignable to an incoupling area of the plurality N2 of incoupling areas of the image sensor.

In particular, the capturing device can include one or more photodiodes, a CCD sensor, a CMOS sensor, and/or a photomultiplier. In particular, the synchronization device can include a clock, which provides a clock signal at a known and constant frequency.

According to a further embodiment of the image sensor, the surface of a respective incoupling area of the plurality N2 of incoupling areas has a predetermined angle with respect to the incident light.

This could also be referred to as the incoupling angle or an angle of incidence. In order to obtain efficient input coupling, it may be advantageous not to align the surface orthogonal to the incident light since an integrated optical waveguide can only transport certain modes, for example material-dependent and structure size-dependent modes. These modes can be excited by light with certain wave vectors.

Here, the wavelength or the frequency of the incident light could also be taken into account.

In particular, the angle of the surface of two incoupling areas could also be different, for example because the respective incoupling areas have different filters.

According to some embodiments of the image sensor, the latter includes an imaging unit for imaging a pattern of a pattern provision device, to be captured by the image sensor, on the plurality N2 of incoupling areas of the image sensor.

By way of example, the imaging unit includes one or more lens elements. In particular, the imaging unit could also include a micro-optical unit, in which one or more lens elements are provided for each N2 incoupling area of the integrated optical image sensor.

In particular, the imaging unit can be configured to generate at the location of the sensor surface of the integrated optical image sensor an image of the pattern to be captured. Further, an advantage of the imaging unit, in particular, can be that it can cause an increase in the luminous power incident on a respective incoupling area. This can, firstly, improve a signal-to-noise ratio and, secondly, reduce a used illumination light power, which allows a reduction in an energy influx, for example into an evacuated projection system of a lithography apparatus.

The imaging unit may also be suitable for imaging a pattern which does not lie in a plane but is curved. Further, the imaging unit could be embodied in such a way that the imaging of the pattern is implemented in an oblique plane in relation to a line of sight from the sensor surface to the pattern provision device.

By way of example, the pattern provision device has a pattern with an information content at spatial frequencies of at least $1/(500\ \mu m)$.

According to some embodiments of the image sensor, a number N4 of secondary integrated optical waveguides and a number N5 of outcoupling areas, with $N5 \geq N4$, are provided. Each of the N5 outcoupling areas can be assigned to one of the N4 secondary integrated optical waveguides and configured to output couple from the assigned secondary integrated optical waveguide a light signal, generated in the assigned secondary integrated optical waveguide, for illuminating the pattern to be captured by the image sensor.

The number N4 of secondary integrated optical waveguides and the number N5 of outcoupling areas can be integrated, for example, on a dedicated substrate or, as an alternative thereto, on the same substrate, in particular on the integrated optical image sensor or chip. The number N4 of secondary integrated optical waveguides and the number N5 of outcoupling areas together can form, for example, an illumination arrangement. A light signal, generated in the N4 secondary integrated optical waveguides, can be guided to the N5 outcoupling areas and is output coupled or emitted there, at least in part, from the respective secondary integrated optical waveguide. Different outcoupling areas, like incoupling areas, may have different properties in order to obtain an advantageous emission behavior. In particular, optical gratings may be provided on a respective outcoupling area in order to achieve a direction-dependent emission.

According to some embodiments of the image sensor, the latter can include an illumination device for generating a light signal in an illumination optical waveguide. Coupled to the illumination optical waveguide may be a distribution apparatus, which is configured to distribute the light signal, generated in the illumination optical waveguide, to the number N4 of secondary integrated optical waveguides.

The illumination device can include one or more illuminants or light sources, for example lasers, gas discharge lamps, incandescent lamps, light-emitting diodes and/or arc lamps. The illumination device can be configured to provide a predetermined light spectrum. In particular, broadband or monochromatic light may be provided. In some embodiments, it may be advantageous for the wavelength of the light to lie in a range between 100 nm and 10 µm.

By way of example, an illumination optical waveguide is embodied as a glass fiber. Hence, the illumination optical waveguide can be configured to transport the light signal generated therein over a relatively large distance, such as 10 m or 50 m, for example. Consequently, the illumination device can be arranged at a distance from the location where the light generated by the illumination device should be used for illumination purposes. In particular, the illumination device can also be efficiently cooled using a simple technical approach as a result thereof.

The illumination optical waveguide or waveguides can be coupled to the distribution device. By way of example, the distribution device is a passive integrated optical circuit, which is arranged on the chip on which the N4 secondary integrated optical waveguides are integrated. The distribution device could also be referred to as a splitter. The distribution device can distribute the light signal supplied by the illumination optical waveguide or waveguides among the N4 secondary integrated optical waveguides, which guide the light signal to the N5 outcoupling areas.

This arrangement can allow the pattern to be captured to be illuminated in advantageous fashion, without waste heat of a light source arising in the region where the illumination is used.

According to some embodiments of the image sensor, the number N4 of secondary integrated optical waveguides and the number N5 of outcoupling areas and/or the distribution apparatus can be integrated on the substrate.

Particularly advantageously, both the image capture and the illumination can consequently be arranged on a single integrated optical substrate.

According to a further embodiment of the image sensor, $16 \leq N2 \leq 16384$, for example, $256 \leq N2 \leq 4096$ applies.

The plurality N2 of incoupling areas can set the number of pixels in the reconstructed image. In particular, each pixel in the reconstructed image can correspond to exactly one incoupling area.

According to some embodiments of the image sensor, a structure dimension of the N1 integrated optical waveguides and/or of the N4 secondary integrated optical waveguides is less than 1 µm, such as less than 500 nm, for example, less than 150 nm.

The smaller the structure dimension of the integrated optical waveguide, the higher integration density can be. A substrate area can be used more efficiently with a higher integration density, allowing production costs to be lowered. Further, an increased resolution can improve the quality of the image capture by the image sensor.

According to some embodiments of the image sensor, an edge length of a pixel of the image sensor can lie in the range between 5 µm and 500 µm, in particular between 40 µm and 160 µm.

In relation to the sensor surface of the image sensor, a pixel corresponds, for example, to a square area, within which a respective incoupling area lies. By way of example, the incoupling area can form a fraction of the pixel area.

In the case of a pixel edge length of 100 µm and $N2=4096$ incoupling areas, the image sensor can have, e.g., 64×64 pixels which could be arranged in a square matrix, as a result of which the image sensor has a sensor surface of 6.4×6.4 $mm^2=40.96\ mm^2$.

According to a second aspect, a position sensor apparatus for ascertaining a position of at least one mirror of a lithography apparatus is proposed. The position sensor apparatus includes a pattern provision device, coupled to the mirror, for providing a pattern which has information content at spatial frequencies of at least $1/(500\ \mu m)$, an image sensor for capturing the provided pattern and for providing a reconstructed image of the captured pattern, and an image evaluation device for ascertaining the position of the mirror on the basis of the reconstructed image. The image sensor corresponds to the image sensor of the first aspect or of one of the embodiments.

The present position sensor apparatus can capture an image of the provided pattern and hence also can be referred to as an image-based position sensor apparatus or an image-based position sensor.

By using the pattern with information content at spatial frequencies of at least $1/(500\ \mu m)$, the present position sensor apparatus can be able to provide high measurement accuracy. Here, the spatial frequencies of at least $1/(500\ \mu m)$ cam determine a minimum accuracy of the position determination ensured by the present position sensor apparatus. Even if the pattern contains spatial frequencies of only to $1/(500\ \mu m)$, measurement accuracies that are much more accurate than 1 µm are possible.

By way of the image-based position sensor apparatus, it is possible to also capture parasitic effects, such as scaling or tilting of the pattern provision device relative to the image sensor, and also compensate these. The image sensor can provide the reconstructed image, in particular as a digital image of the provided pattern. In particular, the digital image can be embodied as an electrical signal or as an electrical signal sequence which contains information about the mirror's position or represents the latter.

In particular, the light signals that represent the pattern can be initially supplied internally by the image sensor in purely optical fashion to the image reconstruction apparatus, and the light signals are only digitized by the latter. As a result of the spatially separated signal capture and digitization of the light signals, a great degree of flexibility can be provided in relation to an arrangement and a computing capacity of the image reconstruction apparatus.

In particular, a pattern should be understood to mean a processed surface, wherein the processed surface has information content at spatial frequencies of at least $1/(500 \, \mu m)$. By way of example, the processed surface can be a metal-processed surface or a printed surface. By way of example, the metal-processed surface can be produced by milling or grinding. By way of example, the material of the pattern can be metal, silicon or glass. By way of example, the pattern can also be embodied as a metal-processed surface of a carrier structure of the mirror. The structuring of the surface of the carrier structure and hence the information content of the pattern can be formed, for example, by milling or grinding the carrier structure. By way of example, the pattern can also be a pattern produced by lithography.

In particular, the image evaluation device can integrated in a digital circuit or digital component. By way of example, the image evaluation device can be part of the image reconstruction apparatus.

An integrated component should be understood to mean an arrangement having a number of integrated circuits and/or parts that are arranged on a carrier printed circuit board or on a plurality of carrier printed circuit boards. The integrated component could also be referred to as integrated sensor electronics.

In the present case, an "integrated circuit" should be understood to mean an electronic circuit (also referred to as monolithic circuit) arranged on a single semiconductor substrate (wafer).

By way of example, the digital circuit can be a programmable digital circuit (field-programmable gate array, FPGA) or an application-specific digital circuit (application-specific integrated circuit, ASIC).

According to a third aspect, a lithography apparatus with a projection system with at least one mirror including the position sensor apparatus as per the second aspect is proposed.

In particular, the lithography apparatus can be an EUV or DUV lithography arrangement. EUV stands for "extreme ultraviolet" and refers to a wavelength of the working light of between 0.1 and 30 nm. DUV stands for "deep ultraviolet" and refers to a wavelength of the working light of between 30 and 250 nm.

According to a fourth aspect, a method for operating an image sensor, in particular an image sensor as per the first aspect, is proposed. In a first step, light, incident on an incoupling area of a plurality N2 of incoupling areas, is coupled into an assigned integrated optical waveguide of a plurality N1 of integrated optical waveguides. In a second step, a light signal is generated in the assigned integrated optical waveguide of the plurality N1 of integrated optical waveguides. In a third step, the plurality N1 of integrated optical waveguides are coupled to a multiplexer apparatus. In a fourth step, the light signals, generated in the N1 integrated optical waveguides, are multiplexed to a number N3 of secondary optical waveguides via the multiplexer apparatus. In a fifth step, the N3 secondary optical waveguides are coupled to an image reconstruction apparatus and, in a sixth step, an image is reconstructed on the basis of the light signals of the N3 secondary optical waveguides via the image reconstruction apparatus.

This method allows advantageous operation of an image sensor, in which the image capture in the form of light signals and the conversion of the captured light signals into electrical signals occur spatially separated from one another.

Furthermore, a computer program product is proposed, the computer program product causing the method as explained above to be carried out on a program-controlled device.

A computer program product, such as e.g. a computer program product, can be provided or supplied, for example, as a storage medium, such as e.g. a memory card, a USB stick, a CD-ROM, a DVD, or else in the form of a downloadable file from a server in a network. By way of example, in a wireless communications network, this can be effected by transferring an appropriate file with the computer program product or the computer program product.

The embodiments and features described for the proposed image sensor can be correspondingly applicable to the proposed method.

Further possible implementations of the disclosure also include not explicitly mentioned combinations of features or embodiments described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below.

BRIEF DESCRIPTION OF THE DRAWINGS

In the text that follows, the disclosure is explained in more detail on the basis of exemplary embodiments and with reference to the accompanying figures.

DESCRIPTION OF EXEMPLARY EMBODIMENTS

Identical elements or elements having an identical function have been provided with the same reference signs in the figures, unless indicated otherwise. Further, the illustrations in the figures are not necessarily true to scale.

Figure 1:
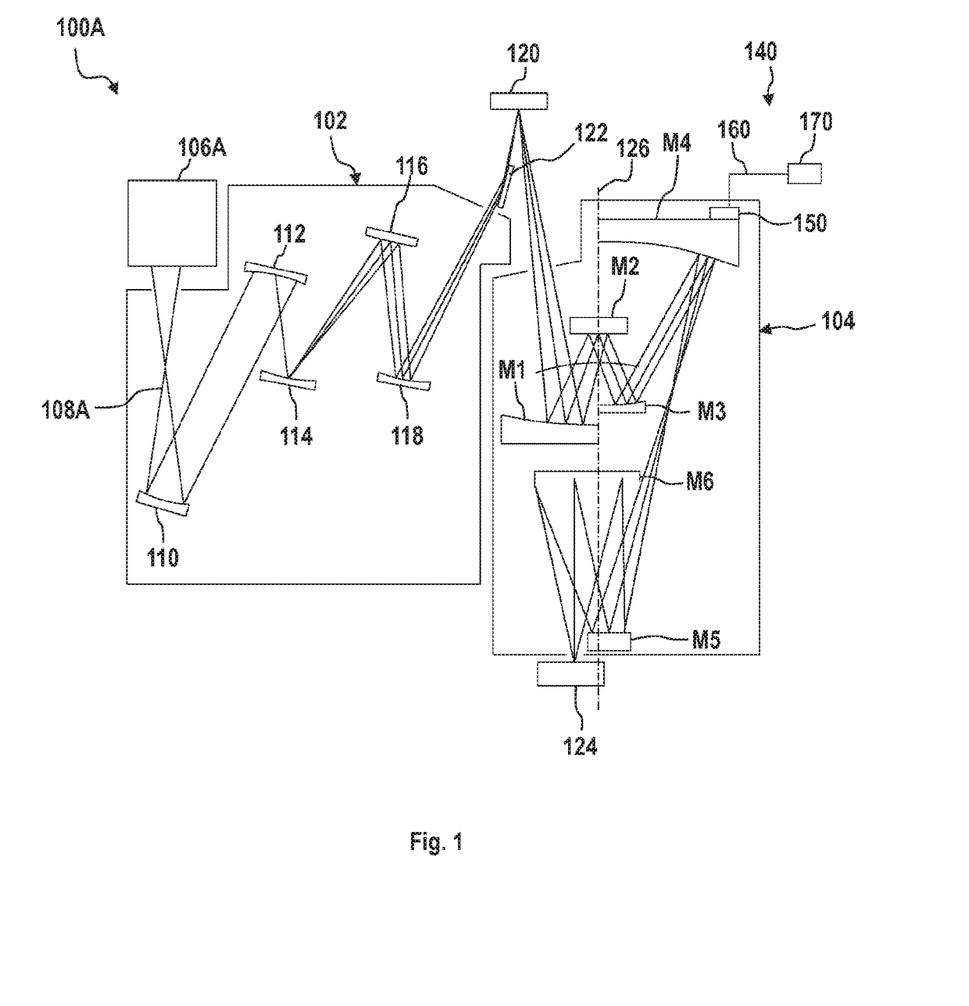
FIG. 1 shows a schematic view of an EUV lithography apparatus.

FIG. 1 shows a schematic view of an EUV lithography apparatus 100A, which includes a beam-shaping and illumination system 102 and a projection system 104. EUV stands for "extreme ultraviolet" and refers to a wavelength of the working light of between 0.1 and 30 nm. The beam-shaping and illumination system 102 and the projection system 104 are respectively provided in a vacuum housing, each vacuum housing being evacuated using an evacuation apparatus that is not depicted more specifically. The vacuum housings are surrounded by a machine room not illustrated in any more detail, in which, e.g., electrical controllers and the like are provided.

The EUV lithography apparatus 100A includes an EUV light source 106A. A plasma source which emits radiation 108A in the EUV range (extreme ultraviolet range), i.e., for example, in the wavelength range of 5 nm to 30 nm, may be provided, for example, as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 depicted in FIG. 1 has five mirrors 110, 112, 114, 116, 118. After passing through the beam shaping and illumination system 102, the EUV radiation 108A is guided onto the photomask (reticle) 120. The photomask 120 is likewise embodied as a reflective optical element and can be arranged outside the systems 102, 104. Furthermore, the EUV radiation 108A may be steered onto the photomask via a mirror 122. The photomask 120 has a structure which is imaged onto a wafer 124 or the like in a reduced fashion by via projection system 104.

The projection system 104 has six mirrors M1-M6 for imaging the photomask 120 onto the wafer 124. In this case, individual mirrors M1-M6 of the projection system 104 can be arranged symmetrically in relation to the optical axis 126 of the projection system 104. It should be noted that the number of mirrors of the EUV lithography apparatus 100A is not restricted to the number illustrated.

More or fewer mirrors could also be provided. Furthermore, the mirrors M1-M6 are generally curved on their front side for beam shaping.

The projection system 104 further has a number of position sensor apparatuses 140 for determining a position of one of the mirrors M1-M6. Without loss of generality and for reasons of simplified illustration, FIG. 1 shows one position sensor apparatus 140. The shown position sensor apparatus 140 includes an internal group 150, which is arranged in the evacuated housing of the projection system 104, and an external group 170, which is arranged outside of the housing, a signal connection 160 transferring signals, in particular optical and electrical signals, between the internal group 150 and the external group 170.

The internal group 150 of the position sensor apparatus 140 includes, in particular, a pattern provision device 142, coupled to the respective mirror M1-M6, and a sensor front end 270, which has a substrate 202 with an integrated optical circuit (see FIGS. 2-8), for example.

The signal connection 160 includes, in particular, a number N3 of secondary optical waveguides 240 (see FIGS. 2-10), a number N4 of illumination optical waveguides 292 (see FIG. 7, 9 or 10), and at least one electrical signal cable for transferring a synchronization signal 260 (see FIG. 6, 7, 9 or 10).

Figure 6:
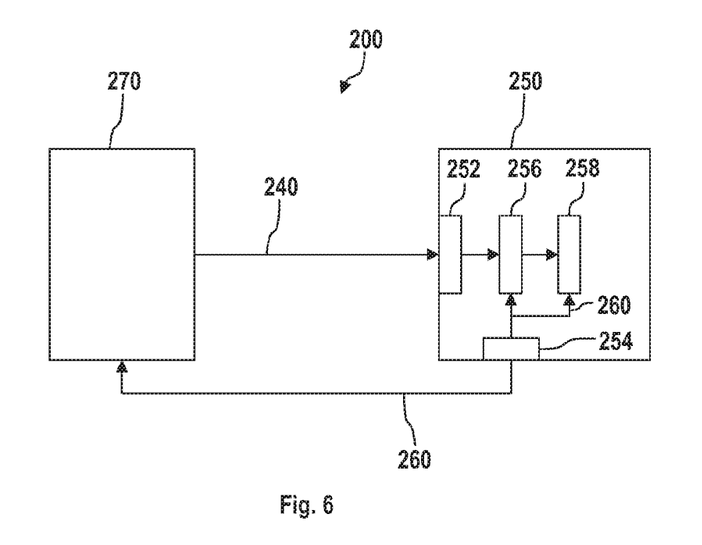
FIG. 6 shows a schematic detailed view of a cross section of a fifth exemplary embodiment of an image sensor.
Figure 7:
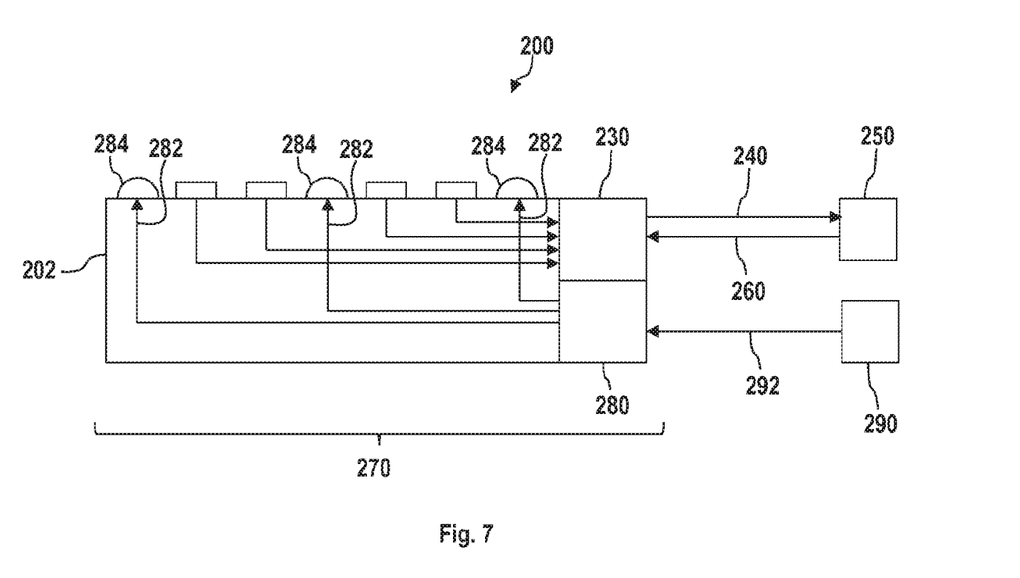
FIG. 7 shows a schematic view of a cross section of a sixth exemplary embodiment of an image sensor.
Figure 8:
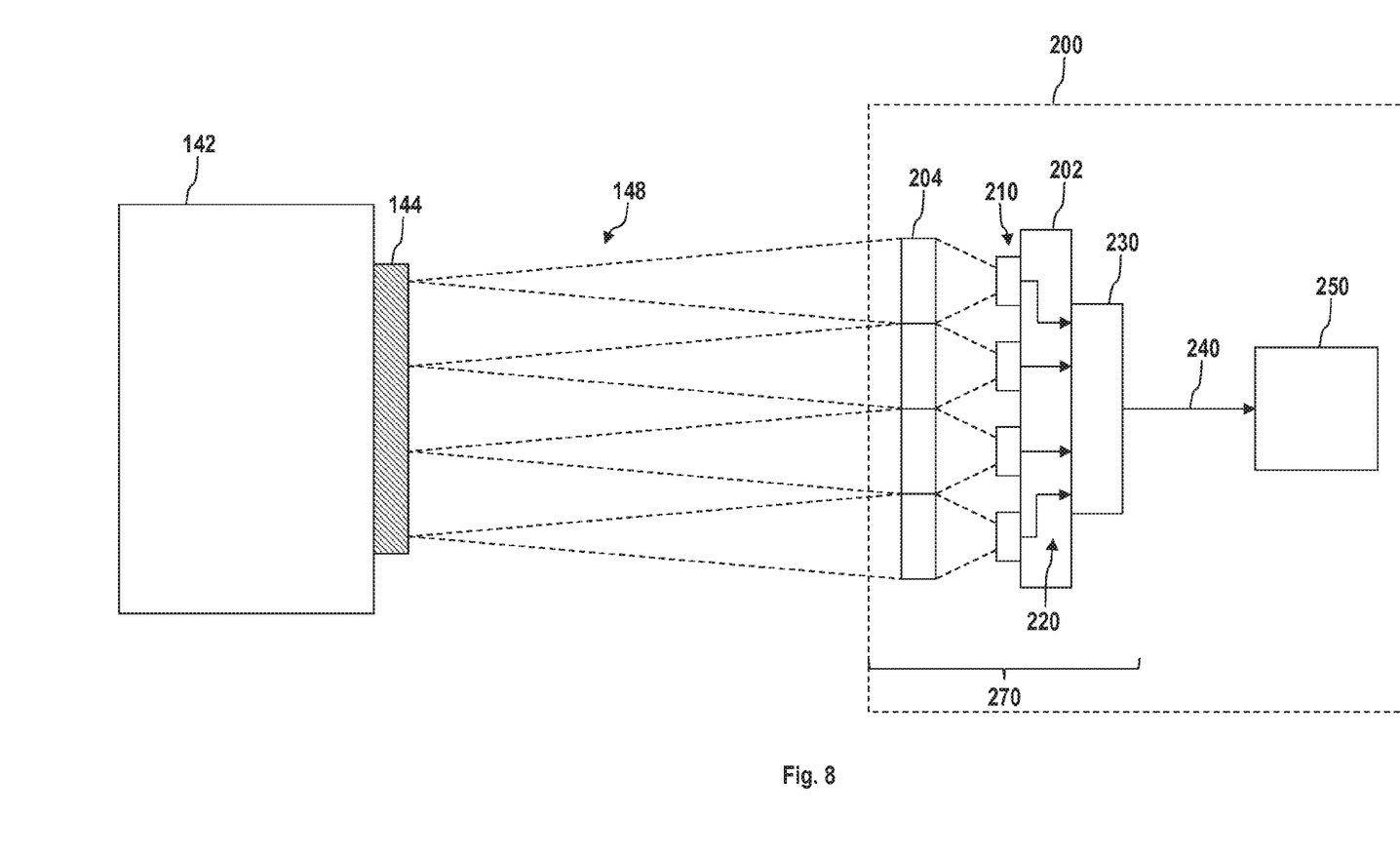
FIG. 8 shows a schematic view of a cross section of a seventh exemplary embodiment of an image sensor.
Figure 9:
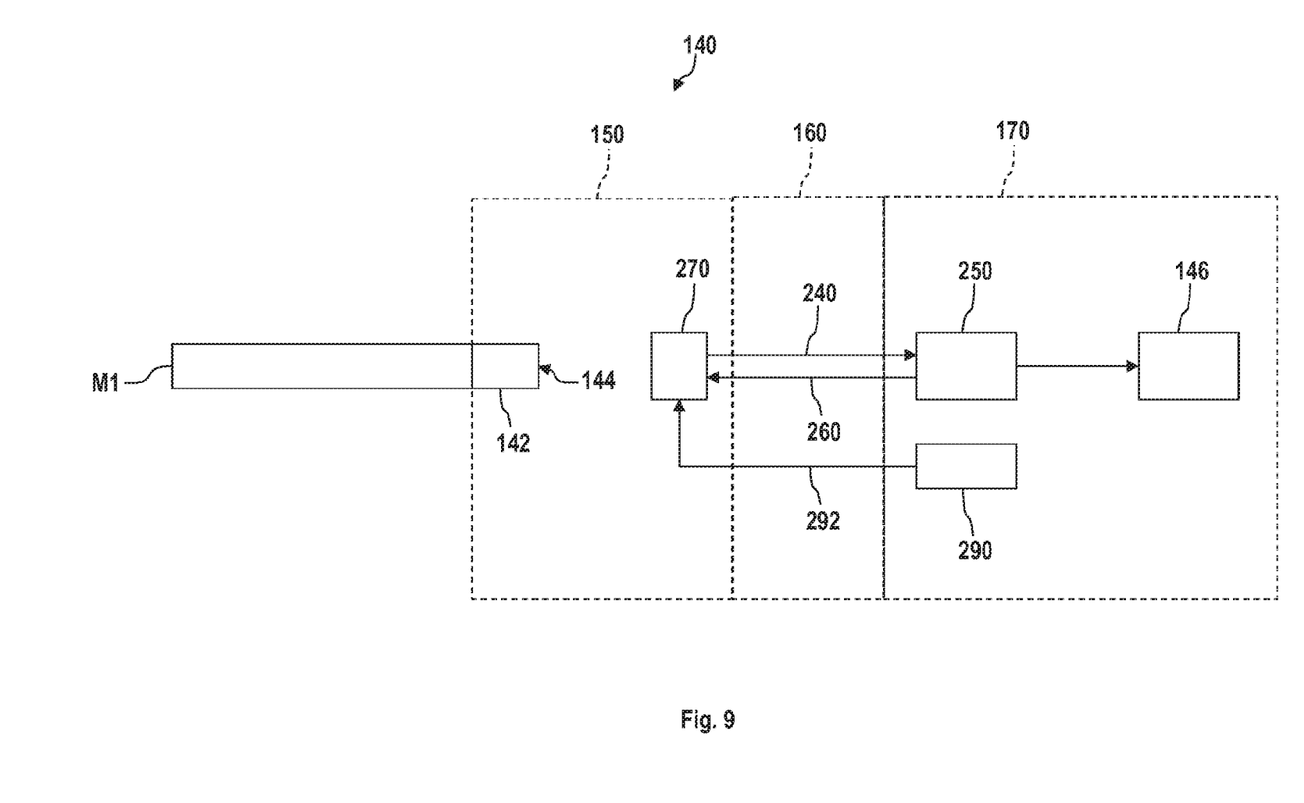
FIG. 9 shows a schematic view of an exemplary embodiment of a position sensor apparatus.

The external group 170 of the position sensor apparatus 140 includes, in particular, an image reconstruction apparatus 250 (see FIGS. 2-9), an image evaluation device 146 (see FIG. 9), and, optionally, an illumination device 290 (see FIG. 7 or 9).

Should a plurality of position sensor apparatuses 140 be provided, provision can advantageously be made for a plurality of internal groups 150 to be coupled via a respective signal connection 160 to a smaller plurality of external groups 170. In particular, should a determination of the position in six axes be desired for one mirror M1-M6, involving, e.g., six of the internal groups 150, only one external group 170 can adopt the capture and evaluation of the image signals for these six internal groups 150. Consequently, this external group 170 supplies complete position information in six axes for the monitored mirror M1-M6.

Figure 2:
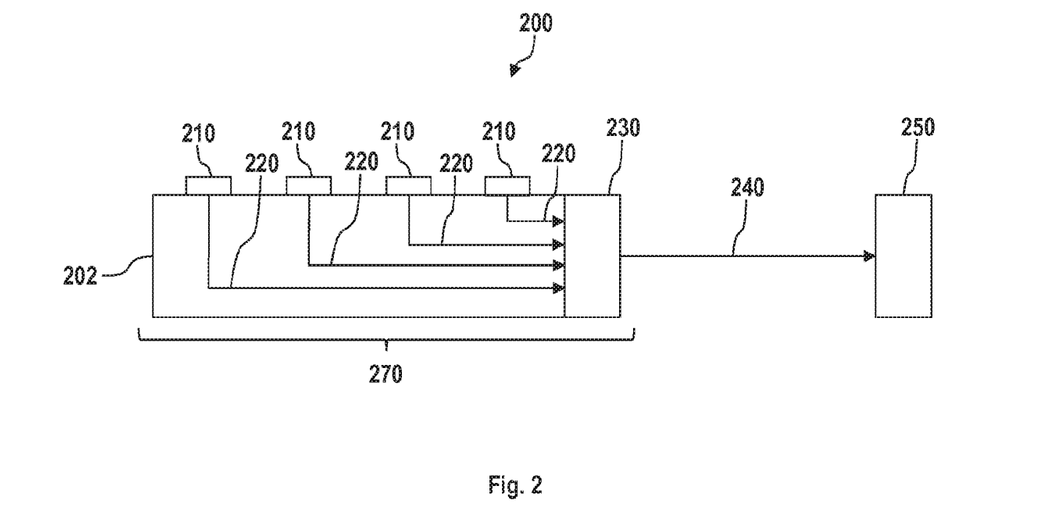
FIG. 2 shows a schematic view of a cross section of a first exemplary embodiment of an image sensor.

FIG. 2 shows a schematic view of a cross section of a first exemplary embodiment of an image sensor 200, which can find use, for example, in the position sensor apparatus 140 of FIG. 1. The image sensor 200 includes a sensor front end 270 with a substrate 202 with a plurality of integrated optical elements 210, 220 230, and also a secondary optical waveguide 240 and an image reconstruction apparatus 250.

In this example, the substrate 202 has N2=4 incoupling areas 210, which are configured to couple light incident thereon into the respective one of the N1=4 integrated optical waveguides 220 such that a light signal is generated in the latter. The four integrated optical waveguides 220 guide the light signals to an integrated optical multiplexer apparatus 230 which is arranged on the same substrate 202. In this view, the four integrated optical waveguides 220 are disposed in layers of the substrate 202 at different depths. However, this only serves to clarify the illustration. In an actual substrate 202, the N1 integrated optical waveguides can be arranged next to one another in the same layer and/or above one another in different layers.

The multiplexer apparatus 230 is configured to multiplex the light signals supplied thereto to a secondary optical waveguide 240 coupled therewith. In this exemplary embodiment, this is a 4×1 multiplexer apparatus 230. By way of example, the secondary optical waveguide 240 is embodied as a glass fiber with a length of 10 m. The glass fiber 240 transmits the light signal input coupled by the multiplexer apparatus 230 to the image reconstruction apparatus 250.

The image reconstruction apparatus 250 captures the supplied light signal and reconstructs an image on the basis of the light signal. In particular, the reconstructed image corresponds to an image present on a surface of the substrate 202. By way of example, details of the image reconstruction apparatus 250 are illustrated in FIG. 6.

Figure 3:
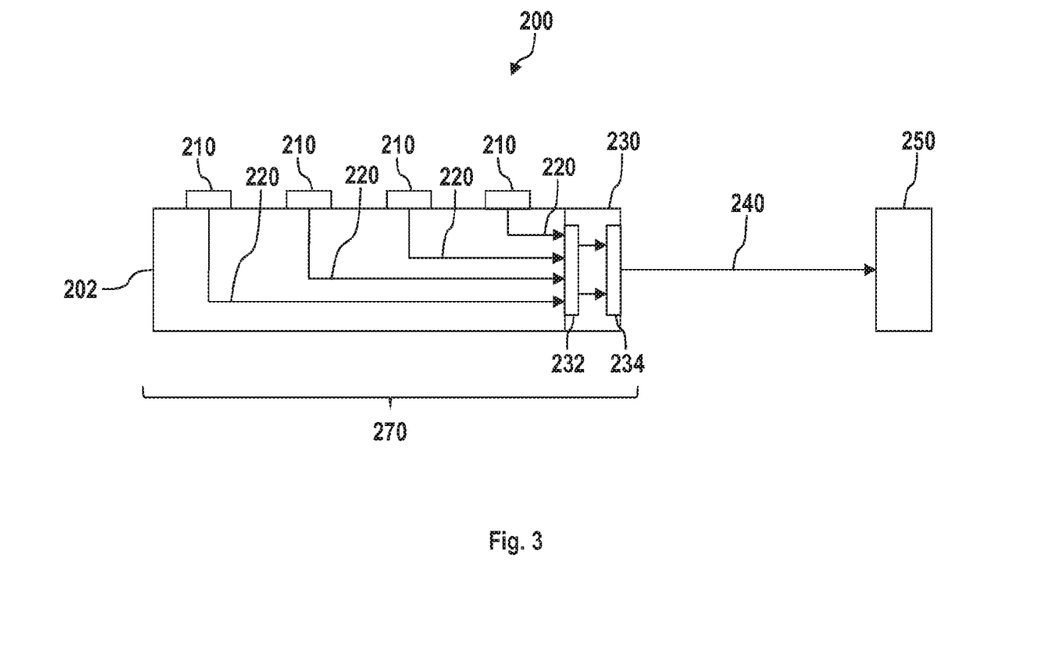
FIG. 3 shows a schematic view of a cross section of a second exemplary embodiment of an image sensor.

FIG. 3 shows a schematic view of a cross section of a second exemplary embodiment of an image sensor 200, which can find use, for example, in the position sensor apparatus 140 of FIG. 1. Deviating from the first exemplary embodiment (see FIG. 2), the second exemplary embodiment has an integrated optical multiplexer apparatus 230 with two stages 232, 234; otherwise, it is identical. By using a plurality of multiplexer stages 232, 234, it is possible, for example, to reduce the complexity of a structure of the multiplexer apparatus 230.

Figure 4:
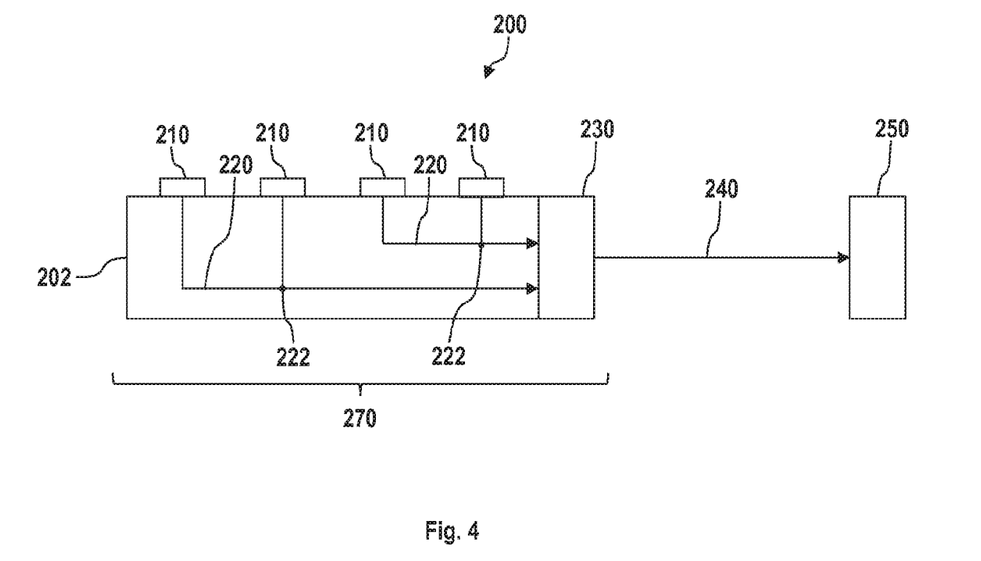
FIG. 4 shows a schematic view of a cross section of a third exemplary embodiment of an image sensor.

FIG. 4 shows a schematic view of a cross section of a third exemplary embodiment of an image sensor 200, which can find use, for example, in the position sensor apparatus 140 of FIG. 1. The third exemplary embodiment differs from the first exemplary embodiment (see FIG. 2) in that the plurality N1=2 of integrated optical waveguides 220 is reduced. In this case, each of the two integrated optical waveguides 220 has two incoupling areas 210 assigned thereto (N2=4), with light signals generated in the integrated optical waveguide 220 by the respective incoupling areas 210 being merged at a junction 222 in the integrated optical waveguide 220. Hence, each of the integrated optical waveguides 220 in this example transmits two light signals. By way of example, the light signals can differ in terms of their polarization or frequency, as a result of which they can be discriminated by way of an appropriate filter. The further properties of the image sensor 200 are identical to the first exemplary embodiment.

Figure 5:
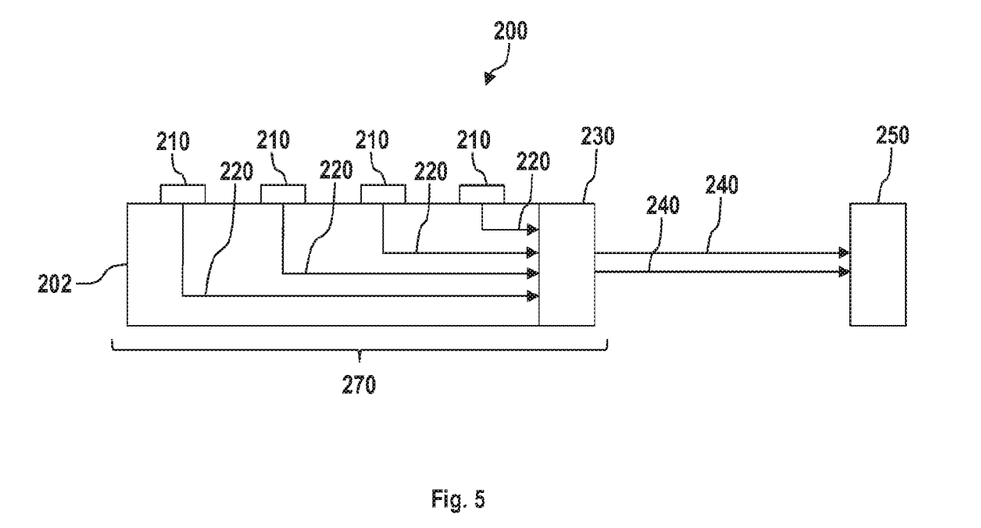
FIG. 5 shows a schematic view of a cross section of a fourth exemplary embodiment of an image sensor.

FIG. 5 shows a schematic view of a cross section of a fourth exemplary embodiment of an image sensor 200, which can find use, for example, in the position sensor apparatus 140 of FIG. 1. In contrast to the first exemplary embodiment (see FIG. 2), two secondary optical waveguides 240 are provided in this case. Accordingly, the illustrated multiplexer apparatus 230 is embodied as a 4×2 multiplexer. The image reconstruction apparatus 250 is accordingly configured to capture the light signals from the two secondary optical waveguides 240 and reconstruct the image on the basis of the captured light signals. The further details correspond to those of the first exemplary embodiment.

FIG. 6 shows a schematic view of a cross section of a fifth exemplary embodiment of an image sensor 200, which can find use, for example, in the position sensor apparatus 140 of FIG. 1. In this sixth exemplary embodiment, the image reconstruction apparatus 250, in particular, is shown in detail. For the sake of clarity, the details of the sensor front end 270 were not illustrated (in this respect, see, e.g., FIG. 2-5, 7, 8 or 10).

Accordingly, the image reconstruction apparatus 250 has a capturing device 252, which is embodied as a photodiode here and which is configured to capture the light signals supplied by the secondary optical waveguide 240 and convert these into an electrical signal. The electrical signal generated by the photodiode 252 correlates with a brightness or intensity of a respective light signal, in particular. The electrical signal generated by the photodiode 252 is supplied to an analog-to-digital converter 256 (A/D converter). Further, provision can be made for the electrical signal of the photodiode 252 to be supplied to an amplifier (not illustrated), which amplifies the electrical signal and outputs the amplified signal to the A/D converter 256. The A/D converter 256 converts the electrical signal into a digital data signal. The digital data signal is a 12-bit bit string, for example, which includes brightness information. Consequently, 4096 brightness levels are distinguishable using this digital data signal. Thus, a single digital data signal includes an information item that depends on the light incident on the corresponding incoupling area 210. The digital data signal is output to an image processor 258. From a plurality of N2 received digital data signals, the image processor 258 reconstructs an image with N2 pixels, which corresponds in terms of the information content to the image on the sensor surface of the sensor front end 270.

Furthermore, the image reconstruction apparatus 250 includes a synchronization device 254. The synchronization device 254 is embodied as a clock and provides a synchronization signal 260. This synchronization signal 260, or a synchronization signal derived therefrom, is firstly transferred to the multiplexer apparatus 230 via an electrical signal line and secondly also transferred to the A/D converter 256 and the image processor 258. The synchronization signal 260 serves to synchronize the multiplexer apparatus 230, the A/D converter 256, and the image processor 258. The synchronization device 254 interacts with the multiplexer apparatus 230, the A/D converter 256, and the image processor 258 in such a way that a unique assignment of a light signal captured by the capturing device 252 to one of the N2 incoupling areas 210 is ensured. This allows every digital data signal to be uniquely assigned to the correct pixel for the reconstructed image.

FIG. 7 shows a schematic view of a cross section of a sixth exemplary embodiment of an image sensor 200, which can find use, for example, in the position sensor apparatus 140 of FIG. 1. In particular, this sixth exemplary embodiment has the features of the first exemplary embodiment (see FIG. 2) and of the fifth exemplary embodiment (see FIG. 6), with the details of the image reconstruction apparatus 250 not being illustrated here for reasons of clarity. Further, the reference signs for the incoupling areas 210 and the integrated optical waveguides 220 were dispensed with for reasons of clarity (see, e.g., FIG. 2).

The sixth exemplary embodiment of the image sensor 200 is additionally configured to provide light for illumination purposes, for example for illuminating a pattern 144 (see, e.g., FIG. 8 or FIG. 9). To this end, the sensor front end 270 includes additional integrated optical structures. In particular, the substrate 202 has N4=3 secondary integrated optical waveguides 282, which are configured to guide a light signal to N5=3 outcoupling areas 284 arranged on a surface of the substrate 202. The light signal can emerge from the three secondary integrated optical waveguides 282 via the three outcoupling areas 284. Further, provision is made of an integrated optical distribution apparatus 280, which distributes an externally supplied light signal among the three secondary integrated optical waveguides 282.

An illumination device 290, which is embodied as a laser diode, for example, is provided to generate the light signal. Initially, the laser diode 290 generates a light signal in an illumination optical waveguide 292, which is embodied as a glass fiber, for example. By way of example, the glass fiber 292 can have a length of more than 10 m. Hence, the laser diode 290 is flexibly arrangeable, in particular at a location where efficient cooling is easily realizable. As an alternative or in addition to a laser diode, provision can be made of a further illumination device 290, for example an arc lamp or any other light source (not illustrated). Further, a glass fiber bundle can be provided instead of a glass fiber (not illustrated).

The glass fiber 292 is coupled to the distribution apparatus 280. In this example, the distribution apparatus 280, as a passive integrated optical structure, is arranged on the same substrate 202 as the further integrated optical structures of the sensor front end 270 of the image sensor 200. The distribution apparatus 280 distributes the light signal input coupled by the glass fiber 292 among the three secondary integrated optical waveguides 282, which guide the light signal to the three outcoupling areas 284, which allow the light signal to leave the secondary integrated optical waveguides 282.

This sixth exemplary embodiment in FIG. 7 shows three secondary integrated optical waveguides 282 and three outcoupling areas 284. Deviating herefrom, more or fewer secondary integrated optical waveguides 282 and/or outcoupling areas 284 could also be provided. Further, a deviating arrangement of the outcoupling areas 284, in particular, could be provided, for example only at the edge of the substrate 202. Provision can also be made for the distribution apparatus 280, the secondary integrated optical waveguides 282, and the outcoupling areas 284 to be arranged on a dedicated substrate 202, i.e., separately from the incoupling areas 210, integrated optical waveguides 220, and/or the multiplexer apparatus 230. In this case, the sensor front end 270 would include two substrates 202 (not illustrated).

FIG. 8 shows a schematic view of a cross section of a seventh exemplary embodiment of an image sensor 200, which can find use, for example, in the position sensor apparatus 140 of FIG. 1. The image sensor 200 in the seventh exemplary embodiment includes a substrate 202 with four incoupling areas 210 and four integrated optical waveguides 220. In this exemplary embodiment, the multiplexer apparatus 230 is arranged on a separate integrated optical component, which is arranged next to the substrate 202 in such a way that it can multiplex light signals from the integrated optical waveguides 220 to the secondary optical waveguide 240. The multiplexer apparatus 230 is embodied as a 4×1 multiplexer. The image reconstruction apparatus 250 is configured to reconstruct an image on the basis of the light signals supplied by the secondary optical waveguide 240.

In particular, the image sensor 200 in this exemplary embodiment includes an imaging apparatus 204, which is arranged spatially upstream of the substrate 202 on the side of the incoupling areas 210. The imaging apparatus 204 is embodied as a micro-optical unit, which is configured to image an object point to be imaged, of the pattern 144 in the present case, on an incoupling area 210. This is indicated by the light beams 148 drawn using dashed lines. Accordingly, the micro-optical unit 204 generates an image representation of the pattern 144 on the sensor surface on which the incoupling areas 210 are arranged.

Consequently, the sensor front end 270 in this exemplary embodiment includes the micro-optical unit 204, the substrate 202 with the incoupling areas 210 and integrated optical waveguides 220, and the multiplexer apparatus 230.

In addition to the image sensor 200, FIG. 8 also shows a pattern provision device 142, which provides the pattern 144. In particular, the pattern 144 has information content at predetermined spatial frequencies, which allows determination of a relative displacement of the pattern 144 from a reference position, for example an information content at 1/(500 µm). Both the desired information content of the pattern 144 and the desired resolution of the image sensor 200 depend, in particular, on the desired accuracy of the determination of such a relative displacement. In particular, the resolution of the image sensor 200 corresponds to the plurality N2 of incoupling areas 210.

FIG. 9 shows a schematic view of an exemplary embodiment of a position sensor apparatus 140, which can be used, for example, for ascertaining a position of a mirror M1-M6 of an EUV lithography apparatus 100A, as illustrated in FIG. 1. The position sensor apparatus 140 includes the internal group 150, likewise illustrated in FIG. 1, the external group 170, and the signal connection 160.

Firstly, the internal group 150 includes the pattern provision device 142 with the pattern 144, which is arranged at a mirror M1, which is part of a projection system 104 of the EUV lithography apparatus 100A (see FIG. 1), for example, and the position of which should be monitored or determined in the present case. Additionally, the internal group 150 includes the sensor front end 270. No details of the sensor front end 270 have been illustrated here for reasons of clarity. In particular, the sensor front end 270 can be embodied like in one of the exemplary embodiments illustrated in FIGS. 2-8.

Figure 10:
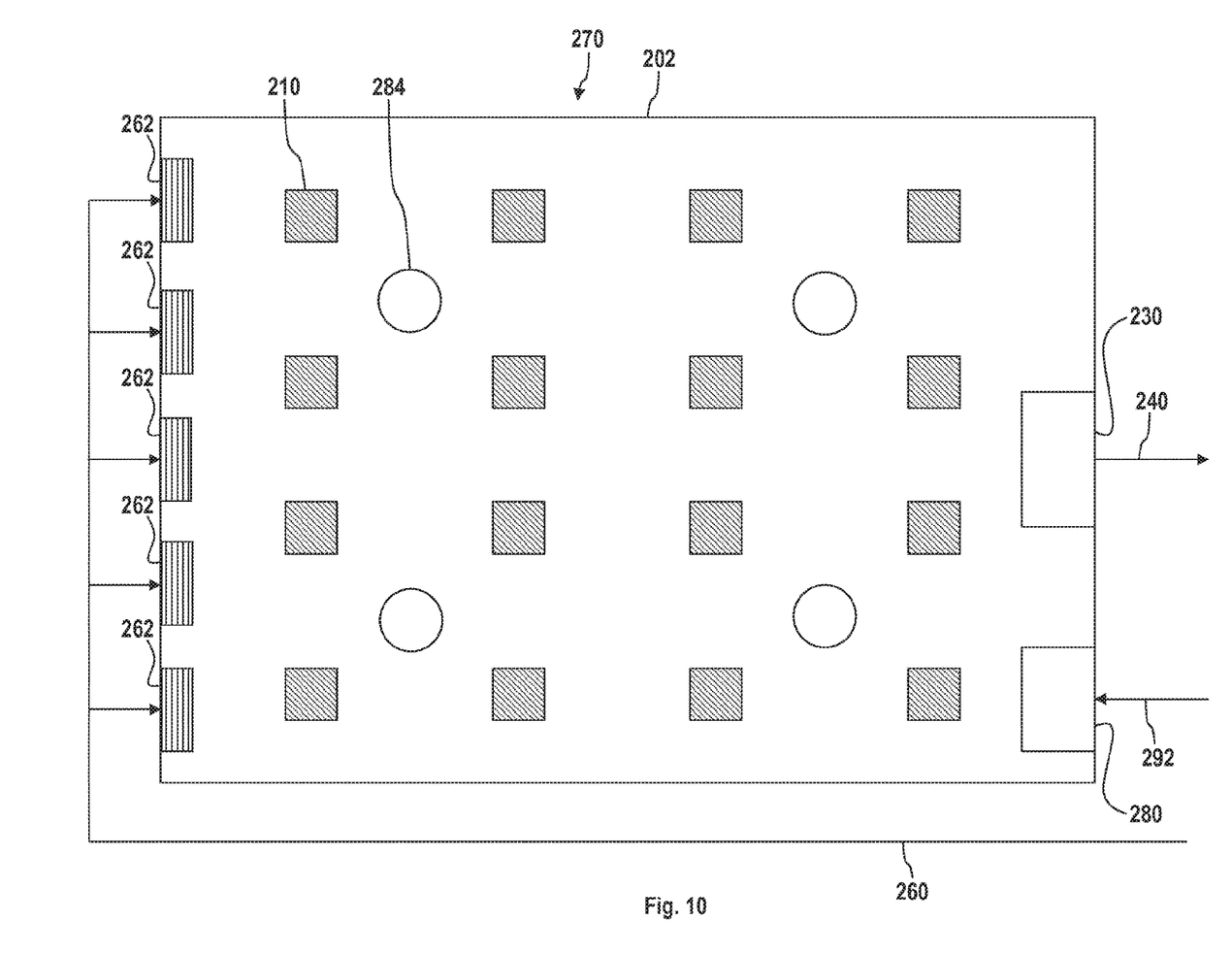
FIG. 10 shows a plan view of an exemplary embodiment of an integrated optical image sensor.

FIG. 10 shows a plan view of an exemplary embodiment of a sensor front end 270, which is integrated in a single substrate 202 in the present case. By way of example, the illustrated exemplary embodiment is usable in a position sensor apparatus 140 of FIG. 1 or 9.

This exemplary embodiment only illustrates the components/functional units arranged on the surface of the substrate 202; the functional units buried in a lower layer in the substrate 202 have not been shown. The latter are, in particular, integrated optical waveguides 220 (see FIGS. 2-8), secondary integrated optical waveguides 282 (see FIG. 7), and electronic signal connections.

In the illustrated exemplary embodiment, N2=16 incoupling areas 210, which are arranged in a rectangular 4×4 matrix arrangement, are arranged on the surface. Only one of the incoupling areas 210 has been labeled by a reference sign in order to keep the illustration clear. Furthermore, N5=4 outcoupling areas 284 are arranged between the incoupling areas 210. Again, only one of the outcoupling areas 284 is labeled by a reference sign. A multiplexer apparatus 230 is arranged on the right-hand side of the substrate 202 in the drawing; it is coupled to a secondary optical waveguide 240. Each of the incoupling areas 210 is configured to generate a light signal in an integrated optical waveguide 220 (not illustrated) to which it is assigned. The integrated optical waveguides 220 guide the light signals to the multiplexer apparatus 230, which transmits the latter in accordance with a specified multiplexing method to the secondary optical waveguide 240. A distribution apparatus 280 is disposed below the multiplexer apparatus 230 in the drawing, likewise on the right-hand side of the substrate 202. The distribution apparatus is coupled to an illumination optical waveguide 292. By way of example, the illumination optical waveguide 292 guides a monochromatic light signal, which is generated by an illumination apparatus 290 (see, e.g., FIG. 7 or 9), not illustrated here, e.g., a laser source, to the distribution apparatus 280. The distribution apparatus 280 distributes the light signal among a number N4 of secondary integrated optical waveguides 282 (not illustrated), which supply the light signal to the four outcoupling areas 284, by which the light signal can be output coupled from the secondary integrated optical waveguides 282.

A total of five contact points 262, which are supplied with the synchronization signal 260, for example, by way of a signal line, are arranged on the left-hand side of the substrate 202 in the drawing. The contact points 262 are connected to the multiplexer apparatus 230 for the purposes of driving the latter via electrical signal lines, not illustrated here, which are integrated in the substrate 202. An individual control signal can be supplied to each of the contact points 262 via the synchronization signal 260. As an alternative to this illustration, provision can be made for the contact points 262 to be arranged on the back side of the substrate 202.

Figure 11:
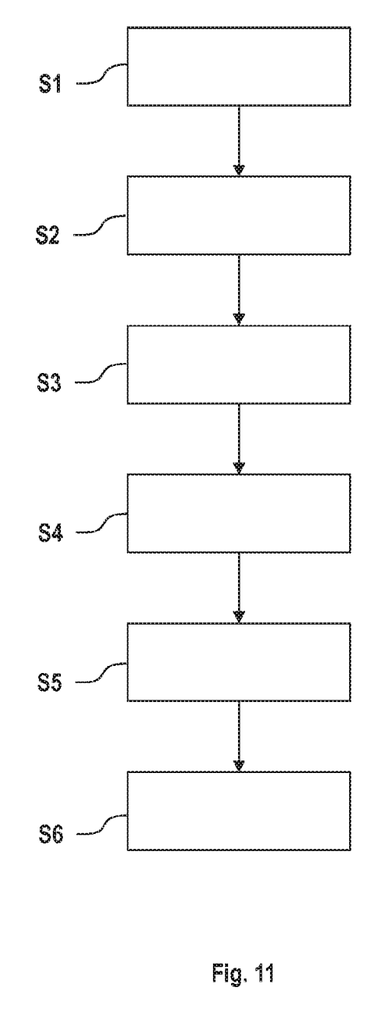
FIG. 11 shows a block diagram of an exemplary embodiment of a method for operating an image sensor.

FIG. 11 shows a block diagram of an exemplary embodiment of a method for operating an image sensor 200, for example the image sensor 200 of one of the exemplary embodiments in FIGS. 2-8.

In a first method step S1, light is coupled from an incoupling area 210 into an integrated optical waveguide 220. In a second method step S2, a light signal is generated in the assigned integrated optical waveguide 220. In a third method step, the plurality N1 of integrated optical waveguides 220 are coupled to a multiplexer apparatus 230. The multiplexer apparatus 230 is configured to multiplex the light signals to a number N3 of secondary optical waveguides 240 in a fourth method step S4. In a fifth method step S5, the number N3 of secondary optical waveguides 240 are coupled to an image reconstruction apparatus 250. The image reconstruction apparatus 250 captures the light signals and reconstructs an image on the basis of the captured light signals in a sixth method step S6.

Although the present disclosure has been described on the basis of exemplary embodiments, it is modifiable in diverse ways.

LIST OF REFERENCE SIGNS

100 Lithography apparatus
100A EUV lithography apparatus
102 Beam shaping and illumination system
104 Projection system
106A EUV light source
108A EUV radiation
110 Mirror
112 Mirror
114 Mirror
116 Mirror
118 Mirror
120 Photomask
122 Mirror
124 Wafer
126 Optical axis of the projection system
136 Mirror
137 Vacuum housing
140 Position sensor apparatus
142 Pattern provision device
144 Pattern
146 Image evaluation device
148 Light beams
150 Internal group
160 Signal connection
170 External group
200 Image sensor
202 Substrate
204 Imaging unit
210 Incoupling area
220 Integrated optical waveguide
230 Multiplexer apparatus
232 Multiplexer stage
234 Multiplexer stage
240 Secondary optical waveguide
250 Image reconstruction apparatus
252 Capturing device
254 Synchronization device
256 Analog-to-digital converter
258 Image processor
260 Synchronization signal
262 Contact point
270 Sensor front end
280 Distribution apparatus
282 Secondary integrated optical waveguide
284 Outcoupling area
290 Illumination device
292 Illumination optical waveguide
M1 Mirror
M2 Mirror
M3 Mirror
M4 Mirror
M5 Mirror
M6 Mirror
S1 Method step
S2 Method step
S3 Method step
S4 Method step
S5 Method step
S6 Method step

What is claimed is:

1. An image sensor, comprising:
a substrate;
a plurality N1 of integrated optical waveguides;
a plurality N2 of incoupling areas;
a multiplexer apparatus; and
an image reconstruction apparatus,
wherein:
N2≥N1;
each of the N2 incoupling areas is assigned to one of the N1 integrated optical waveguides;
each of the N2 incoupling areas is configured to couple incident light into its assigned integrated optical waveguide so a light signal is generated in the assigned integrated optical waveguide;
the multiplexer apparatus is coupled to the N1 integrated optical waveguides to multiplex the light signals generated in the N1 integrated optical waveguides to a number N3 of secondary optical waveguides;
N1≥N3;
the image reconstruction apparatus is coupled to the N3 secondary optical waveguides to reconstruct an image on the basis of the light signals of the N3 secondary optical waveguides; and
the plurality N2 of incoupling areas, the plurality N1 of integrated optical waveguides, and the multiplexer apparatus are integrated on the substrate.

2. The image sensor of claim 1, wherein the multiplexer apparatus is configured to multiplex the light signals via at least one method selected from the group consisting of a time-division multiplexing method, a frequency-division multiplexing method, and a code-division multiplexing method.

3. The image sensor of claim 1, wherein the image reconstruction apparatus further comprises:
a capturing device configured to capture the light signals of the N3 secondary optical waveguides; and
a synchronization device configured to drive the multiplexer apparatus via a synchronization signal so that a respective light signal captured by the capturing device is uniquely assignable to an incoupling area of the plurality N2 of incoupling areas of the image sensor.

4. The image sensor of claim 1, wherein a surface of a respective incoupling area of the plurality N2 of incoupling areas has a predetermined angle with respect to the incident light.

5. The image sensor of claim 1, further comprising an imaging unit configured to image a pattern a pattern provision device, to be captured by the image sensor, on the plurality N2 of incoupling areas of the image sensor.

6. The image sensor of claim 1, wherein:
the image sensor comprises a number N4 of secondary integrated optical waveguides and a number N5 of outcoupling areas;
N5≥N4;
each of the N5 outcoupling areas is assigned to one of the N4 secondary integrated optical waveguides; and
each of the N5 outcoupling areas is configured to output couple from the assigned secondary integrated optical waveguide a light signal, generated in the assigned secondary integrated optical waveguide, to illuminate a pattern of a pattern provision device to be captured by the image sensor.

7. The image sensor of claim 6, further comprising an illumination device configured to generate a light signal in an illumination optical waveguide and a distribution apparatus coupled to the illumination optical waveguide to distribute the light signal generated in the illumination optical waveguide among the number N4 of secondary integrated optical waveguides.

8. The image sensor of claim 6, wherein at least two members selected from the group consisting of the number N4 of secondary integrated optical waveguides, the number N5 of outcoupling areas, and the distribution apparatus are integrated on the substrate.

9. The image sensor of claim 6, wherein a structure dimension of at least one member selected from the group consisting of the N1 integrated optical waveguides and the N4 secondary integrated optical waveguides is less than 100 μm.

10. The image sensor of claim 1, wherein 16≤N2≤16384.

11. The image sensor of claim 1, wherein an edge length of a pixel of the image sensor lies in the range between 5 μm and 1 mm.

12. The image sensor of claim 1, wherein the image sensor is configured to be used in a position sensor apparatus to ascertain a position of at least one mirror of a lithography apparatus.

13. A position sensor apparatus, comprising:
a pattern provision device configured to be coupled to a mirror of a lithography apparatus and configured to provide a pattern comprising information content at spatial frequencies of at least 1/(500 μm);
an image sensor according to claim 1, the image sensor configured to capture the pattern and to provide a reconstructed image of the captured pattern; and
an image evaluation device configured to ascertain the position of the mirror on the basis of the reconstructed image.

14. A lithography apparatus, comprising:
a projection system comprising a mirror; and
a position sensor apparatus, comprising:
a pattern provision device configured to be coupled to a mirror of a lithography apparatus and configured to provide a pattern comprising information content at spatial frequencies of at least 1/(500 μm);
an image sensor according to claim 1, the image sensor configured to capture the pattern and to provide a reconstructed image of the captured pattern; and
an image evaluation device configured to ascertain the position of the mirror on the basis of the reconstructed image.

15. The apparatus of claim 14, further comprising an illumination system.

16. The apparatus of claim 15, further comprising an EUV light source.

17. A method of using a lithography apparatus comprising an illumination system and a projection system, the method comprising:
using the illumination system to illuminate a mask comprising a structure; and
using the projection system to project the illuminated structure onto a second substrate,
wherein the lithography apparatus comprises an image sensor according to claim 1.

18. A method of operating an image sensor for a position sensor apparatus for ascertaining a position of a mirror of a lithography apparatus, the method comprising:
coupling light, incident on an incoupling area of a plurality N2 of incoupling areas, into an assigned integrated optical waveguide of a plurality N1 of integrated optical waveguides;
generating a light signal in the assigned integrated optical waveguide of the plurality N1 of integrated optical waveguides;
coupling the plurality N1 of integrated optical waveguides with a multiplexer apparatus;
using the multiplexer apparatus to multiplex the light signals, generated in the N1 integrated optical waveguides, to a number N3 of secondary optical waveguides via the multiplexer apparatus;
coupling the N3 secondary optical waveguides with an image reconstruction apparatus; and
reconstructing an image on the basis of the light signals of the N3 secondary optical waveguides via of the image reconstruction apparatus,
wherein the plurality N2 of incoupling areas, the plurality N1 of integrated optical waveguides, and the multiplexer apparatus are integrated on a substrate.

19. The method of claim 18, wherein using the multiplexer apparatus to multiplex the light signals comprises using at least one method selected from the group consisting of a time-division multiplexing method, a frequency-division multiplexing method, and a code-division multiplexing method.

20. The method of claim 18, wherein:
the image reconstruction apparatus further comprises a capturing device and a synchronization device; and
the method further comprises:
using the image reconstruction apparatus to capture the light signals of the N3 secondary optical waveguides; and
using the synchronization device to drive the multiplexer apparatus via a synchronization signal so that a respective light signal captured by the capturing device is uniquely assignable to an incoupling area of the plurality N2 of incoupling areas of the image sensor.

* * * * *

UNITED STATES PATENT AND TRADEMARK OFFICE
CERTIFICATE OF CORRECTION

| | |
|---|---|
| PATENT NO. | : 11,262,660 B2 |
| APPLICATION NO. | : 16/987504 |
| DATED | : March 1, 2022 |
| INVENTOR(S) | : Jan Horn et al. |

It is certified that error appears in the above-identified patent and that said Letters Patent is hereby corrected as shown below:

In the Claims

Column 18, Line 65, Claim 5, delete "a pattern a pattern" and insert -- a pattern of a pattern --.

Signed and Sealed this
Twenty-first Day of June, 2022

*Katherine Kelly Vidal*

Katherine Kelly Vidal
*Director of the United States Patent and Trademark Office*